(12) United States Patent
Kosenko et al.

(10) Patent No.: US 9,589,879 B2
(45) Date of Patent: Mar. 7, 2017

(54) SUBSTRATES WITH THROUGH VIAS WITH CONDUCTIVE FEATURES FOR CONNECTION TO INTEGRATED CIRCUIT ELEMENTS, AND METHODS FOR FORMING THROUGH VIAS IN SUBSTRATES

(71) Applicant: Invensas Corporation, San Jose, CA (US)

(72) Inventors: Valentin Kosenko, Palo Alto, CA (US); Sergey Savastiouk, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/697,460

(22) Filed: Apr. 27, 2015

(65) Prior Publication Data
US 2015/0228570 A1 Aug. 13, 2015

Related U.S. Application Data

(62) Division of application No. 13/042,186, filed on Mar. 7, 2011, now Pat. No. 9,018,094.

(51) Int. Cl.
*H01L 23/48* (2006.01)
*H01L 23/498* (2006.01)
(Continued)

(52) U.S. Cl.
CPC .. *H01L 23/49827* (2013.01); *H01L 21/76898* (2013.01); *H01L 23/481* (2013.01);
(Continued)

(58) Field of Classification Search
CPC ..... H01L 21/76898; H01L 2924/12042; H01L 2924/014; H01L 2924/01074;
(Continued)

(56) References Cited

U.S. PATENT DOCUMENTS 3,761,782 A 9/1973 Youmans
4,961,821 A * 10/1990 Drake .................... B41J 2/1603
257/E21.223

(Continued)

FOREIGN PATENT DOCUMENTS

GB 2 150 749 A 7/1985

OTHER PUBLICATIONS

Notice of Allowance dated Jan. 8, 2015 of related U.S. Appl. No. 13/042,186, 9 pages.
Office Action dated Sep. 16, 2014 of related U.S. Appl. No. 13/042,186, 8 pages.
Final Office Action dated Apr. 5, 2013 of related U.S. Appl. No. 13/042,186, 18 pages.
Office Action dated Oct. 10, 2012 of related U.S. Appl. No. 13/042,186, 11 pages.

(Continued)

*Primary Examiner* — Vongsavanh Sengdara
(74) *Attorney, Agent, or Firm* — Haynes and Boone, LLP

(57) ABSTRACT

A through via (144) contains a conductor (244, 276) passing through a substrate (140) for connection to an integrated circuit element. The through via consists of two segments (144.1, 144.2) formed from respective different sides (140.1, 140.2) of the substrate and meeting inside the substrate. Each segment is shorter than the entire via, so via formation is facilitated. The second segment is etched after deposition of an etch stop layer (214) into the first segment. Due to the etch stop layer, the first segment's depth does not have to be rigidly controlled. The conductor is formed by separate depositions of conductive material into the via from each side of the substrate. From each side, the conductor is deposited to a shallower depth than the via depth, so the deposition is facilitated. Other embodiments are also provided.

25 Claims, 16 Drawing Sheets

(51) Int. Cl.
*H01L 21/768* (2006.01)
*H05K 3/42* (2006.01)
*H05K 1/02* (2006.01)
*H01L 23/00* (2006.01)
*H05K 1/03* (2006.01)
*H05K 1/11* (2006.01)

(52) U.S. Cl.
CPC ..... *H01L 23/49822* (2013.01); *H05K 1/0298* (2013.01); *H05K 1/115* (2013.01); *H05K 3/42* (2013.01); *H01L 24/05* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01074* (2013.01); *H01L 2924/12042* (2013.01); *H05K 1/0306* (2013.01); *H05K 1/113* (2013.01); *H05K 2201/0195* (2013.01); *H05K 2201/09563* (2013.01); *H05K 2201/09845* (2013.01); *H05K 2203/1476* (2013.01)

(58) Field of Classification Search
CPC . H01L 2924/01033; H01L 2924/01029; H01L 2924/01006; H01L 2924/01005; H01L 24/05; H01L 23/49827; H01L 23/49822; H01L 23/481; H05K 3/42; H05K 2203/1476; H05K 2201/09845; H05K 2201/09563; H05K 2201/0195; H05K 1/115; H05K 1/113; H05K 1/0306; H05K 1/0298
USPC ........................................................ 257/774
See application file for complete search history.

(56) References Cited

U.S. PATENT DOCUMENTS

| | | | |
|---|---|---|---|
| 5,229,647 | A | 7/1993 | Gnadinger |
| 6,897,148 | B2 | 5/2005 | Halahan et al. |
| 6,958,285 | B2 | 10/2005 | Siniaguine |
| 7,173,327 | B2 | 2/2007 | Siniaguine |
| 8,431,431 | B2 | 4/2013 | Kosenko et al. |
| 8,829,683 | B2 | 9/2014 | Kosenko et al. |
| 9,018,094 | B2 | 4/2015 | Kosenko et al. |
| 2005/0027934 | A1 | 2/2005 | Johnson |
| 2006/0027934 | A1 | 2/2006 | Edelstein et al. |
| 2006/0286798 | A1* | 12/2006 | Lee ................. B81C 1/00301 438/672 |
| 2006/0292866 | A1* | 12/2006 | Borwick ............ H01L 21/288 438/667 |
| 2007/0281459 | A1 | 12/2007 | Nakamura et al. |
| 2008/0073752 | A1* | 3/2008 | Asai ................. H01L 21/76898 257/615 |
| 2008/0160757 | A1 | 7/2008 | Han et al. |
| 2008/0290524 | A1 | 11/2008 | Lanzerotti et al. |
| 2010/0072627 | A1* | 3/2010 | Wang ................ H01L 21/76898 257/774 |
| 2010/0127346 | A1* | 5/2010 | DeNatale ........... H01L 23/481 257/532 |
| 2010/0264548 | A1* | 10/2010 | Sanders ............ H01L 21/76898 257/774 |
| 2011/0062594 | A1* | 3/2011 | Maekawa ........... H01L 21/486 257/774 |
| 2011/0121427 | A1* | 5/2011 | Stupar .............. H01L 21/76898 257/532 |
| 2011/0309520 | A1* | 12/2011 | Inagaki ............ H01L 21/76898 257/774 |
| 2012/0267773 | A1* | 10/2012 | Ebefors ............... B81B 7/007 257/692 |
| 2014/0346646 | A1 | 11/2014 | Kosenko et al. |

OTHER PUBLICATIONS

Notice of Allowance dated Jan. 25, 2013 of related U.S. Appl. No. 13/181,006, 12 pages.
Notice of Allowance dated May 5, 2014 of related U.S. Appl. No. 13/852,322, 10 pages.
Amini, B. Vakili et al., "Sub-Micro-Gravity Capacitive SOI Microaccelerometers," The 13$^{th}$ International Conference on Solid-State Sensors, Actuators and Microsystems, Seoul, Korea, Jun. 5-9, 2005, pp. 515-518.
Bellew, Colby L. et al., "An SOI Process for Fabrication of Solar Cells, Transistors and Electrostatic Actuators," The 12$^{th}$ International Conference on Solid State Sensors, Actuators and Microsystems, Boston, Jun. 8-12, 2003, pp. 1075-1079.
Bauer, Tomas, "High Density Through Wafer Via Technology," Silex Microsystems, NSTI-Nanotech 2007, www.nsti.org, ISBN 1420061844, vol. 3, 2007, pp. 116-119.
Thevenoud, J-M. et al., "DRIE Technology: From Micro to Nanoapplications," Alcatel Micro Machining Systems, ESIEE, no later than Jun. 12, 2011, pp. 1-8.
Thru-Silicon Vias, Current State of the Tehcnology, Jan. 30, 2011, 4 pages.

* cited by examiner

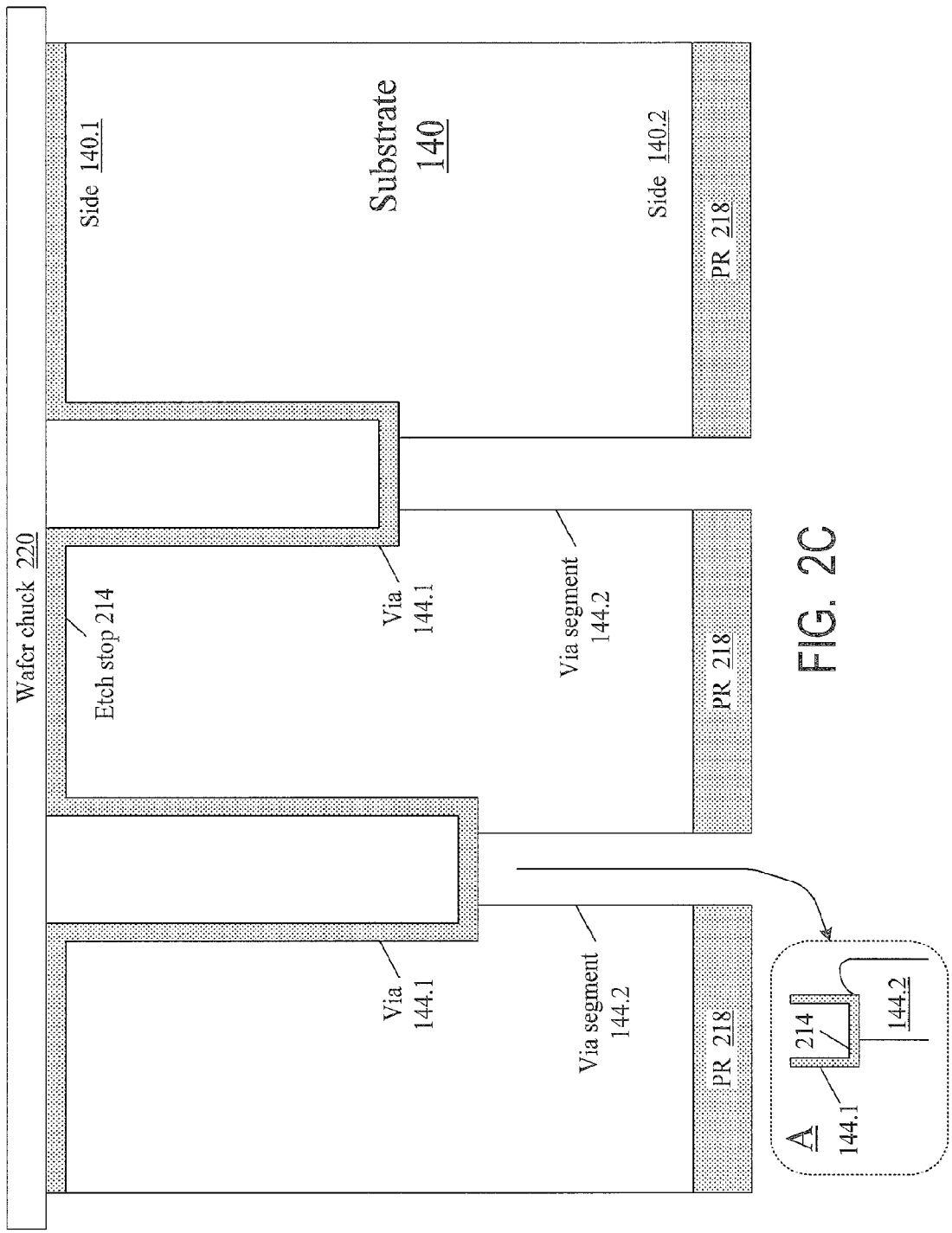

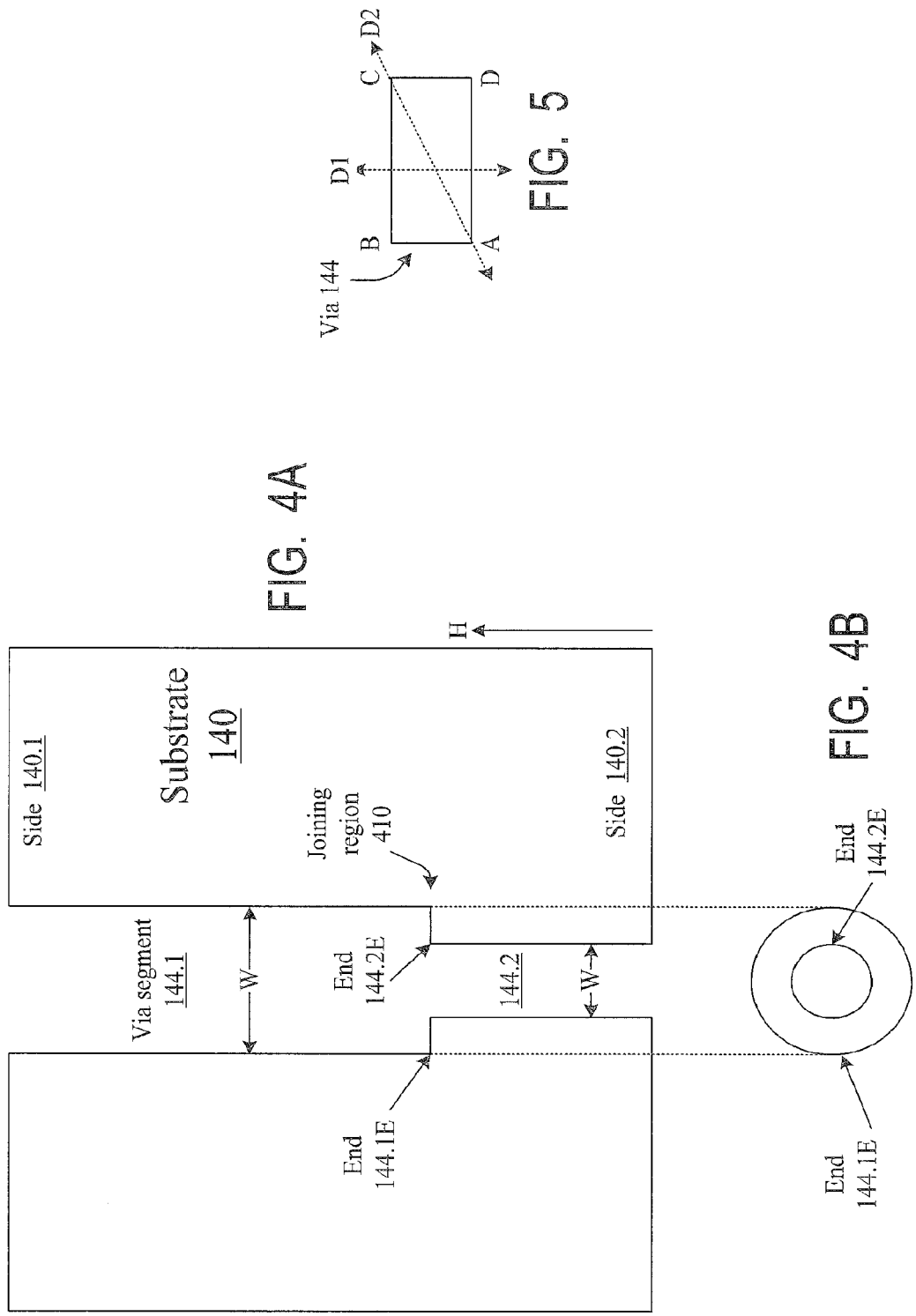

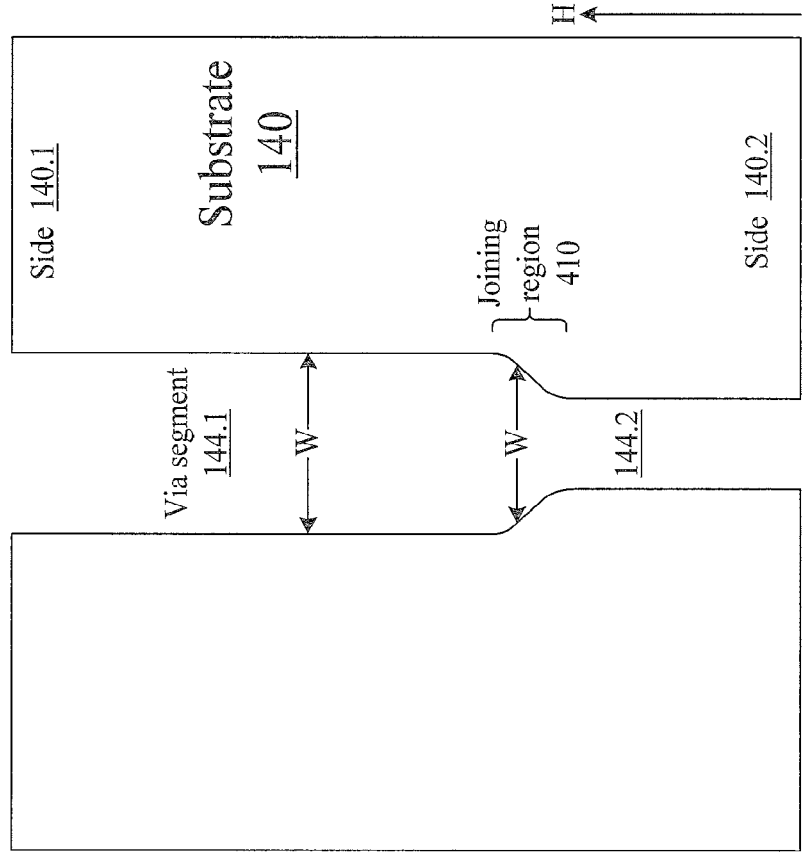

SUBSTRATES WITH THROUGH VIAS WITH CONDUCTIVE FEATURES FOR CONNECTION TO INTEGRATED CIRCUIT ELEMENTS, AND METHODS FOR FORMING THROUGH VIAS IN SUBSTRATES

CROSS REFERENCE TO RELATED APPLICATIONS

This application is a divisional of U.S. patent application Ser. No. 13/042,186, filed on Mar. 7, 2011, entitled "SUBSTRATES WITH THROUGH VIAS WITH CONDUCTIVE FEATURES FOR CONNECTION TO INTEGRATED CIRCUIT ELEMENTS, AND METHODS FOR FORMING THROUGH VIAS IN SUBSTRATES, the full disclosure of which is incorporated by reference herein in its entirety and for all purposes.

BACKGROUND OF THE INVENTION

The present invention relates to integrated circuits, and more particularly to substrates having through vias with conductive features.

Through vias with conductive features in a substrate are used to shorten conductive paths between circuit elements in integrated-circuit packages. For example, FIG. 1 illustrates integrated circuit dies 110 attached to a printed circuit board (PCB) 120 through an interposer 130. The interposer includes a substrate 140 with metalized through vias 144. Compared to a direct attachment of dies 110 to PCB 120, the interposer may redistribute the contact pads to reduce the package area (the area of the entire structure). More particularly, dies 110 have contact pads 110C attached to the interposer's contact pads 130C.1 by solder features 150. The interposer has contact pads 130C.2 attached to contact pads 120C of PCB 120 with other solder features 150. Many fabrication processes allow smaller critical dimensions in dies 110 than in PCB 120. Therefore, the die contacts 110C can be smaller, and spaced closer to each other, than possible for PCB contacts 120C. Interposer 130 includes redistribution (rerouting) layers 154 with conductive lines 158 connecting the interposer contacts 110C.1 to the metal in vias 144. Lines 158 allow the PCB contacts to be redistributed. For example, if a die's contacts 110C are positioned on the die's periphery rather than being evenly distributed over the die's area, the corresponding PCB contacts 120C can be evenly distributed over an area equal to the die's area. Therefore, the spacing between the PCB contacts can be enlarged without increasing the area. Further, some contacts 110C on the same or different dies 110 may be designed for connection to the same input, e.g. the same signal or a power or ground voltage. Such contacts 110C may be connected to a single PCB contact 120C through lines 158, allowing the PCB contacts 120C to be fewer and occupy a smaller area. Thus, the area required for the die attachment is reduced.

Vias 144 should be narrow to reduce the package size. At the same time, the interposer's substrate 140 should be sufficiently thick to withstand the mechanical and electrical stresses and meet the heat distribution requirements during fabrication and operation. These two goals—narrow vias and a thick substrate—drive up the vias' aspect ratio. The high aspect ratio complicates both via formation and via filling with metal. In particular, it is difficult to provide reliable metallization, without voids or breaks, in high-aspect-ratio vias. Hence, the vias are widened to undesirably increase the package area.

SUMMARY

This section summarizes some features of the invention. Other features may be described in the subsequent sections. The invention is defined by the appended claims, which are incorporated into this section by reference.

In some embodiments, the vias 144 are formed from opposite sides of substrate 140. For example, the vias can be etched or drilled part way through the top of substrate 140 and part way through the bottom of substrate 140. Also, metal (or another conductive material) can be deposited into the vias part way through the top and part way through the bottom. When processing part way through the top or the bottom, the via length subject to the processing operation is reduced, effectively reducing the aspect ratio subjected to processing. Therefore, the vias' aspect ratio can be doubled without changing the etch and deposition processes.

In some embodiments, a via contains different segments of different widths. Each segment is etched from just the top or the bottom of the substrate. Different segments of the via may have the same or different aspect ratios.

The invention is not limited to the features and advantages described above except as defined by the appended claims.

Each of FIGS. 2A-2L shows a vertical cross section of a structure with through vias at different stages of fabrication for use in integrated circuit packages according to some embodiments of the present invention.

Figure 3:
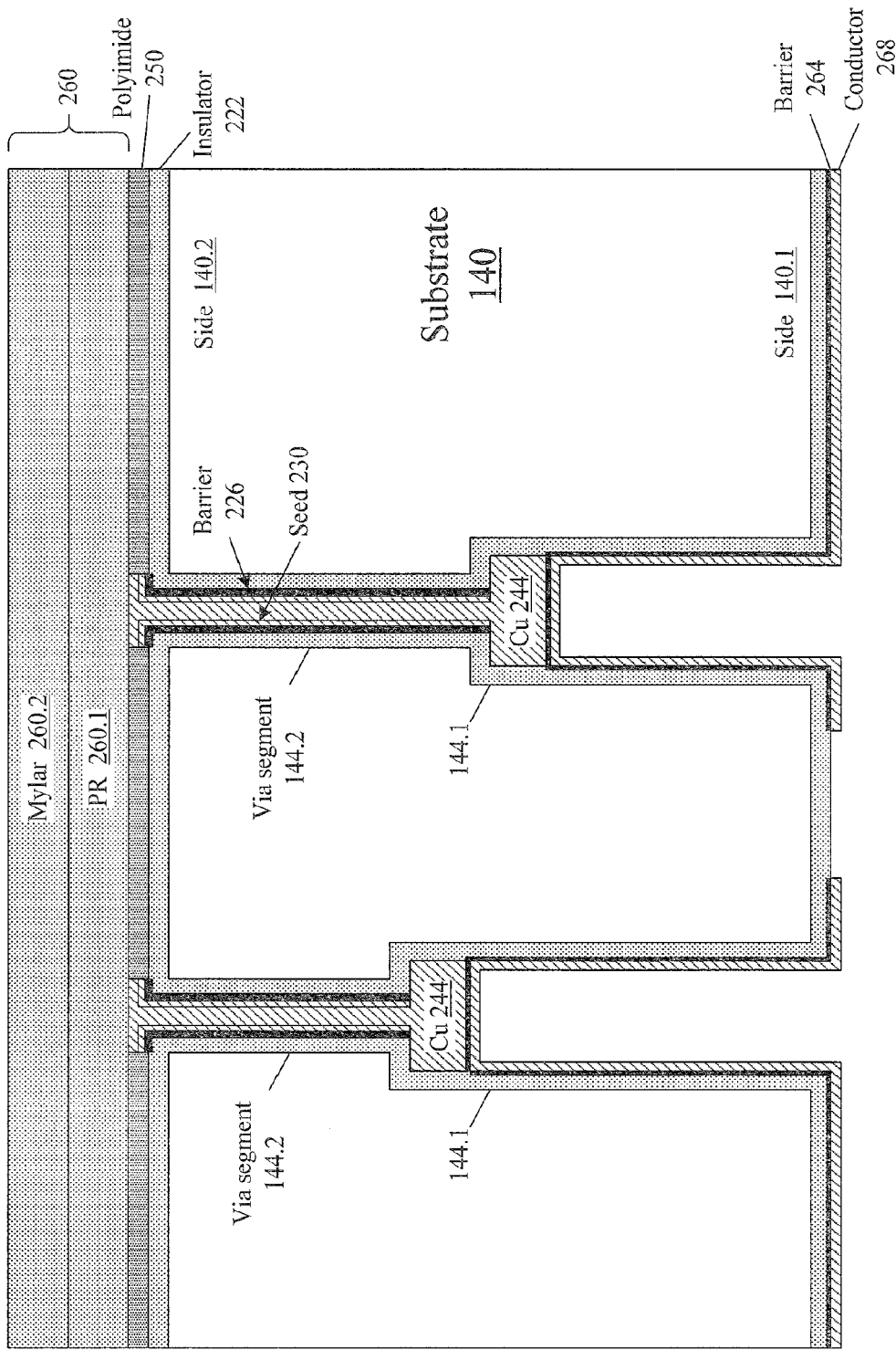

FIG. 3 shows a vertical cross section of a structure with through vias for use in integrated circuit packages according to some embodiments of the present invention.

FIG. 4A shows a vertical cross section of a structure with through vias according to some embodiments of the present invention.

FIG. 4B is a plan view of a part of the structure of FIG. 4A.

FIG. 5 illustrates width computation for a through via according to some embodiments of the present invention.

FIG. 6 shows a vertical cross section of a structure with through vias according to some embodiments of the present invention.

DESCRIPTION OF SOME EMBODIMENTS

The embodiments described in this section illustrate but do not limit the invention. The invention is defined by the appended claims.

Figure 1:
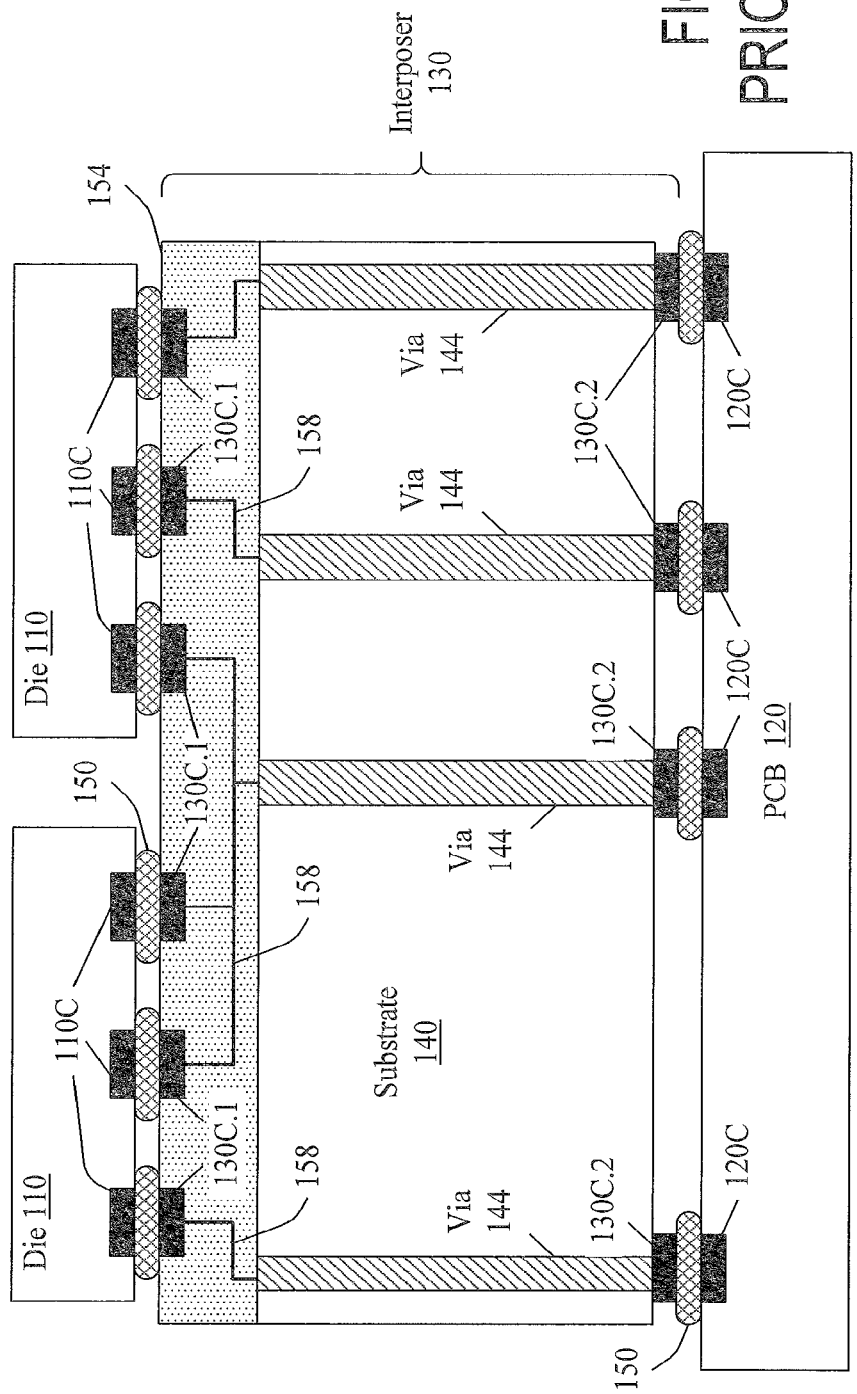
FIG. 1 illustrates a vertical cross section of an integrated circuit package according to prior art.
Figure 2A:
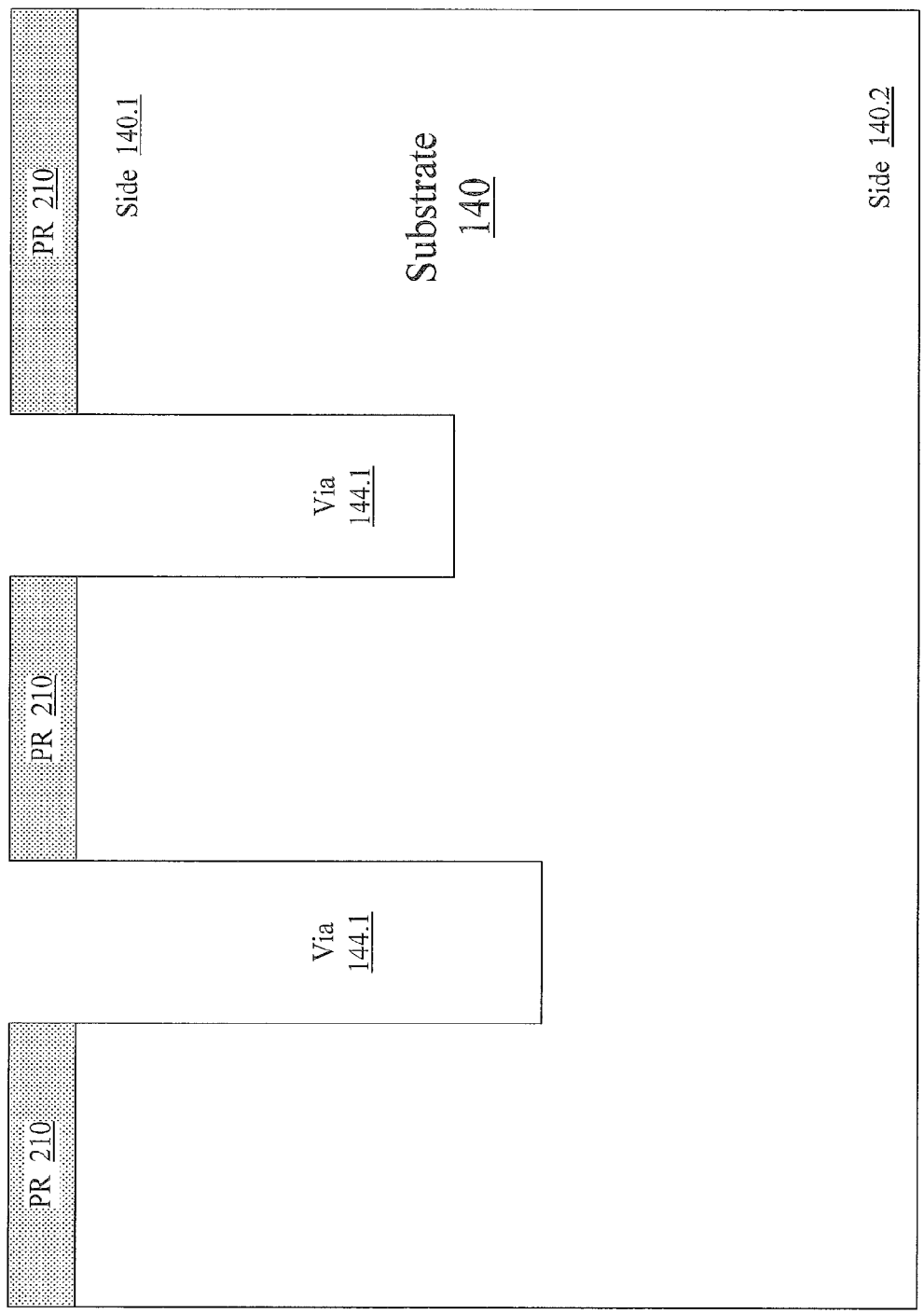
Figure 2B:
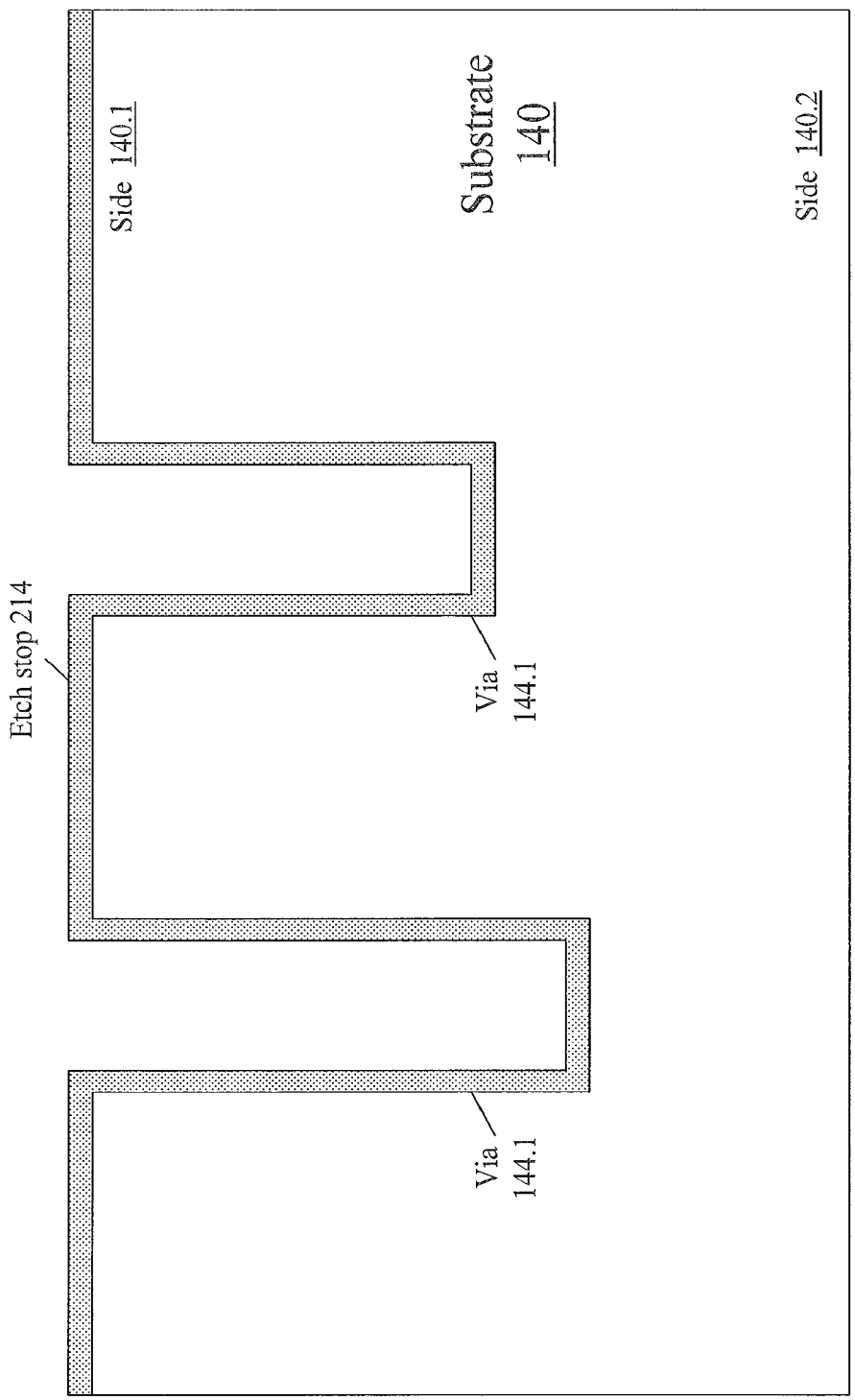

FIG. 2A illustrates the beginning stages of fabrication of metalized vias in a substrate 140 in some embodiments of the present invention. The substrate 140 can be used in an interposer 130 as in FIG. 1, to connect dies 110 to PCB 120. Substrate 140 can also be used to interconnect other structures attached to the top and bottom of the substrate, e.g. dies attached to the top to dies attached to the bottom. The structures attached to the top and bottom of substrate 140 may include other interposers. In other embodiments, substrate 140 is not an interposer but an integrated circuit not attached to any other integrated circuit. Vias 144 can be used to interconnect circuit elements at the top and bottom of substrate 140, or to connect such elements to PCB 120 or to other dies or interposers. Other uses of vias 144 may be possible.

For the sake of illustration, in the example being described, substrate 140 will be assumed made of silicon. In other embodiments, the substrate is made of another semiconductor, insulating, or conductive material (e.g. glass, metal, gallium-arsenide, etc.). The invention is not limited to any particular materials unless stated to the contrary. Substrate 140 will be called a "wafer". The wafer may have any shape (circular, rectangular, etc.).

Wafer 140 may have any suitable thickness, e.g. 750 µm. (All the dimensions are provided for an exemplary embodiment for the sake of illustration, and are not limiting unless stated to the contrary.) A photoresist layer 210 is formed on one side of the wafer. This side will be called the "first" side 140.1 for ease of reference. Resist 210 is patterned to define the vias 144. The vias are etched part way through the wafer. The resulting blind vias are shown as 144.1. Each via 144.1 will provide one segment (the "first" segment) of via 144. The invention is not limited to any number of vias. Some embodiments have thousands of vias in substrate 140. Other embodiments have a single via.

In the embodiment being described, the via segments 144.1 are formed by deep reactive ion etching (DRIE) to the depth of about 250 µm, and are shaped as circular cylinders of 65 µm diameter. Other processes (e.g. laser drilling, without photoresist), and non-circular and non-cylindrical shapes, can also be used. The invention is not limited to the shapes and processes mentioned unless stated to the contrary.

Significantly, the precise control of the via depth is not required for reasons explained below. To illustrate this point, the two vias 144.1 in FIG. 2A slightly differ in depth. The figures may or may not be to scale depending on the embodiment, and the absolute or relative dimensions in the figures do not limit the invention unless stated to the contrary. For example, in some embodiments, the vias may have equal depths.

As noted above, the substrate may include thousands of vias 144, and the relaxed control requirements over the via depth in a deep etch facilitate fabrication and improve the yield.

Photoresist 210 is stripped, and a layer 214 (FIG. 2B) is formed over the entire first side 140.1 of substrate 140. In some embodiments, layer 214 is silicon dioxide formed by thermal oxidation to a thickness of 1 µm. The thermal oxide will also form on the "second" side 140.2 of substrate 140, but this is not shown.

Layer 214 is called an "etch stop" layer because of its role in the etch of the vias' second segments as described below in connection with FIG. 2C. However, layer 214 may have additional uses, e.g. forming insulating features if layer 214 is oxide or some other insulator, or forming conductive features if layer 214 is conductive.

Then substrate 140 may be thinned down from side 140.2, for example by grinding followed by chemical mechanical polishing (CMP). These processes will also remove layer 214 from the second side 140.2 if layer 214 was present on the second side. As a result, substrate 140 may be thinned to its final thickness, e.g. 400 µm for some interposer embodiments.

As shown in FIG. 2C, a photoresist layer 218 is formed on wafer side 140.2 and patterned photolithographically to define segments 144.2 of vias 144. The side 140.2 is etched (e.g. by DRIE) to form the via segments 144.2. The etch is selective to layer 214. Use of layer 214 as an etch stop explains why the precise control over the depths of via segments 144.1 was not required. Each via 144 consists of a segment 144.1 and a segment 144.2. (The etching processes described above may also form vias other than vias 144, and such other vias may be blind vias formed only in side 140.1 or only in side 140.2.)

In the embodiment being described, via segments 144.2 are shaped as circular cylinders of a diameter smaller than the diameter of via segments 144.1. The smaller diameter facilitates the alignment between via segments 144.1, 144.2 of each via 144. In some embodiments, the segment 144.2 diameter is 45 µm for the 65 µm diameter of segments 144.1. (Other diameters, and non-circular or non-cylindrical vias, can also be used, and further different via segments 144.1, 144.2 may have respective different shapes and dimensions in the same substrate 140.) If each segment 144.2 is smaller than the corresponding segment 144.1, then it is easier to avoid the problem illustrated in insert A. In insert A, the etch of segment 144.2 extends past the bottom of segment 144.1, and the resulting irregular shape of the via 144 sidewall complicates further processing (and in particular metal filling). The maximum width of via 144 is also undesirably increased. Thus, the smaller size of via segments 144.2 relaxes the alignment tolerances in aligning via segments 144.1 and 144.2 of the same via 144, and allows in some embodiments to use cheaper processes to pattern the resist 218, e.g. a one-step process instead of a stepper. (In some embodiments, the maximum process error in resist 218 patterning is 5 µm.)

In some embodiments, layer 214 in vias 144 simplifies wafer handling for the etch of via segments 144.2. For example, the wafer can be held by a wafer chuck 220 during the etch. Layer 214 protects the wafer chuck from the etchant (the etchant can be fluorine in a DRIE etch; ionized fluorine is highly chemically active, so chuck protection is desired). Some embodiments use an electrostatic chuck. The DRIE etch uses fluorine supplied to the wafer side 140.2 at a temperature slightly under 90° C. and a pressure in a millitorr range (e.g. 20 mTorr). In electrostatic chuck 220, the wafer is cooled by helium supplied to the wafer side 140.1 at a temperature below 0° C. and a pressure of about 10 Torr. Therefore, the helium pressure and temperature are significantly lower than the pressure and temperature at wafer side 140.2. Layer 214 separates helium from the fluorine etchant, allowing the pressure and temperature at side 140.2 to be maintained as needed for the wafer etch.

As should be clear from the description above, the wider size of via segments 144.1 is achieved through patterning of resist layers 210 and 218. However, if etch stop layer 214 is a thermal oxide, then the wider size of via segments 144.1 can be at least partially achieved by controlling silicon oxidation (FIG. 2B) in forming the layer 214 because the oxidation consumes silicon at the sidewalls of via segments 144.1 to widen these segments.

Figure 2D:
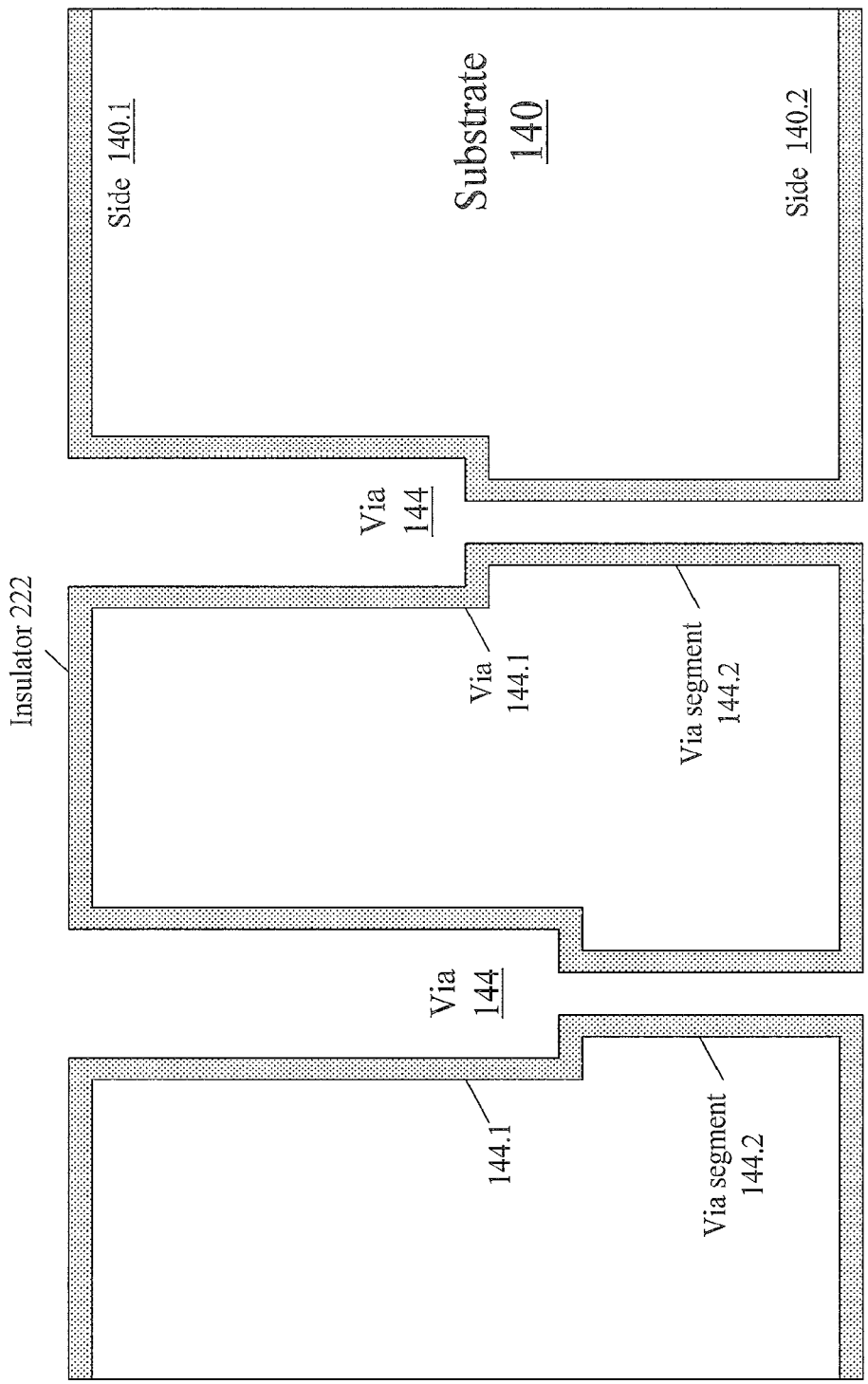
Figure 2E:
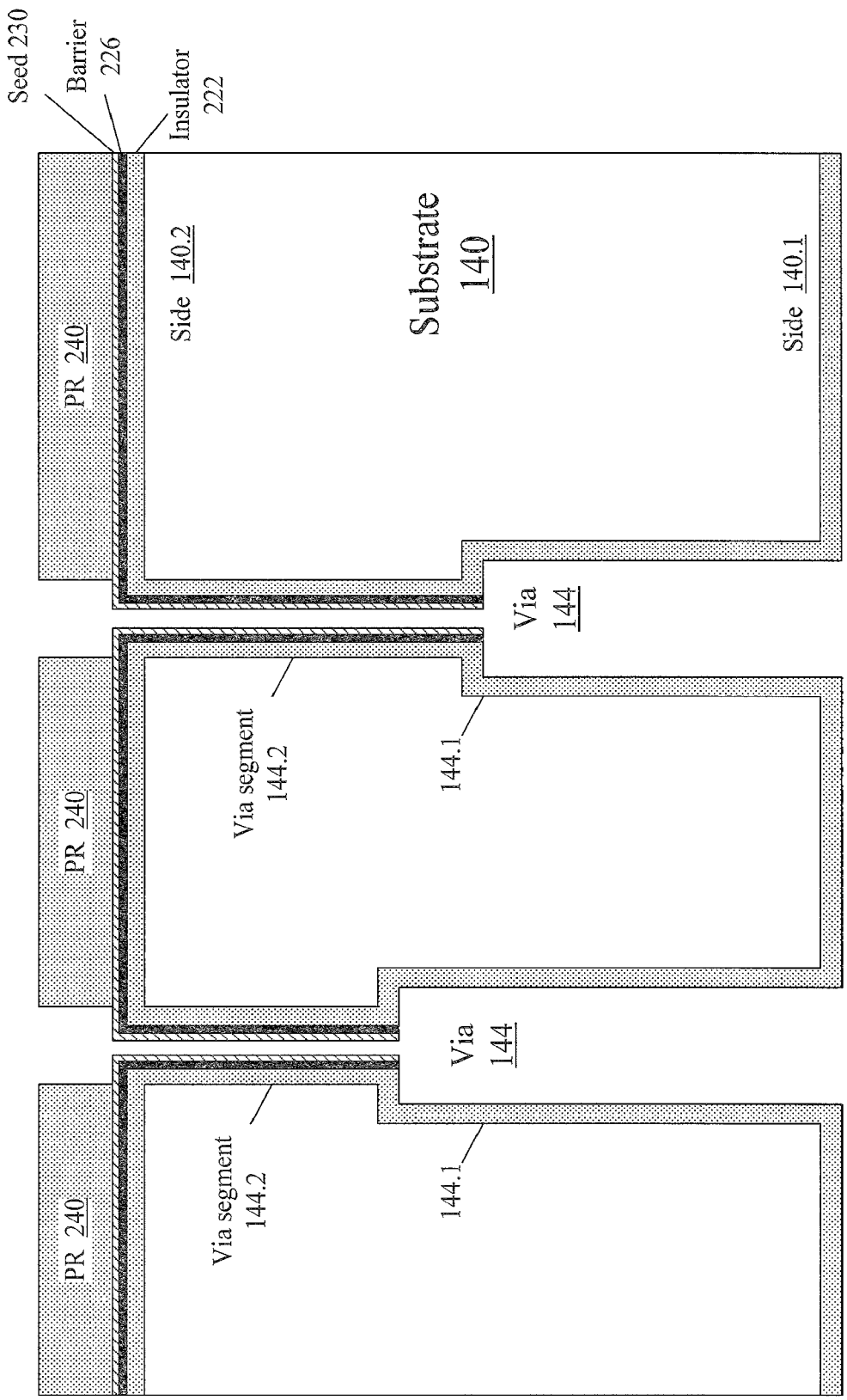

As illustrated in FIG. 2D, photoresist 218 and then layer 214 are removed. Via segments 144.1, 144.2 become interconnected in each via 144. In some embodiments, layer 214 can be removed by a wet etch. In some embodiments (not shown), part of layer 214 stays on the wafer.

An insulating layer 222 is formed on the sidewalls of vias 144 and, possibly, on other surfaces of substrate 140 (including the entire top and bottom surfaces in the embodiment being described). Insulator 222 can be silicon dioxide formed by thermal oxidation to an exemplary thickness of 1 µm (or some other suitable thickness; as noted above, the dimensions are illustrative and not limiting). In other embodiments, layer 222 includes polyimide by itself or over thermal silicon dioxide. Other insulating materials can also be used. (If substrate 140 is itself an insulator, e.g. glass, then layer 222 is omitted in some embodiments.)

Next (FIG. 2E), the wafer is prepared for electrodeposition of metal into the narrower via segments 144.2. (The invention is not limited to electrodeposition or to metal however.) The wafer 140 is shown with side 140.2 on top. A barrier layer 226 (e.g. 250 µm thick titanium-tungsten) is deposited (e.g. by physical vapor deposition (PVD), possibly sputtering) on side 140.2. Then a seed layer 230 is deposited on barrier layer 226. For example, the seed layer can be copper initially deposited to a 1 µm thickness by PVD, e.g. sputtering. (If desired, the seed layer thickness can be increased by electrodeposition of additional copper.)

Barrier layer 226 and seed layer 230 cover the side 140.2 and the sidewalls of narrow via segments 144.2, but are not formed in wide via segments 144.1. For example, in a PVD deposition, via segments 144.1 are shielded from side 140.2 by the sidewalls of via segments 144.2. It is desirable not to form seed layer 230 in segments 144.1 in order to reduce subsequent electrodeposition of copper into segments 144.1. This will ensure that the copper will be electroplated to a shallower depth, not the entire depth of vias 144. Hence, discontinuities and voids will be easier to avoid in the copper.

Advantageously, good quality of the barrier and seed layers 226 and 230 is needed only in via segments 144.2, i.e. to a shallower depth than the entire vias 144. Therefore, formation of layers 226 and 230 is facilitated.

An electroplating mask 240 is then formed by depositing photoresist over the substrate's second side 140.2 and photolithographically patterning the resist to expose the vias 144 and, possibly, areas immediately adjacent to the vias. In some embodiments, the exposed areas are 65 µm in diameter around each via segment 144.2, and each via segment 144.2 is at the center of the exposed area. In addition, mask 240 exposes seed layer 230 at the edges (not shown) of substrate 140 for connection to the cathode of a power supply (not shown) in the subsequent electroplating step. Other areas (not shown) may also be exposed if electroplating is to be performed on those areas.

Copper 244 (FIG. 2F) is electroplated on the exposed surfaces of seed layer 230 and, possibly, some adjacent areas. Copper may reach, and partially fill, the portions of segments 144.1 adjacent to segments 144.2. An exemplary copper thickness in vias 144.1 is 50 µm. Copper may protrude above the photoresist 240 as shown.

Figure 2F:
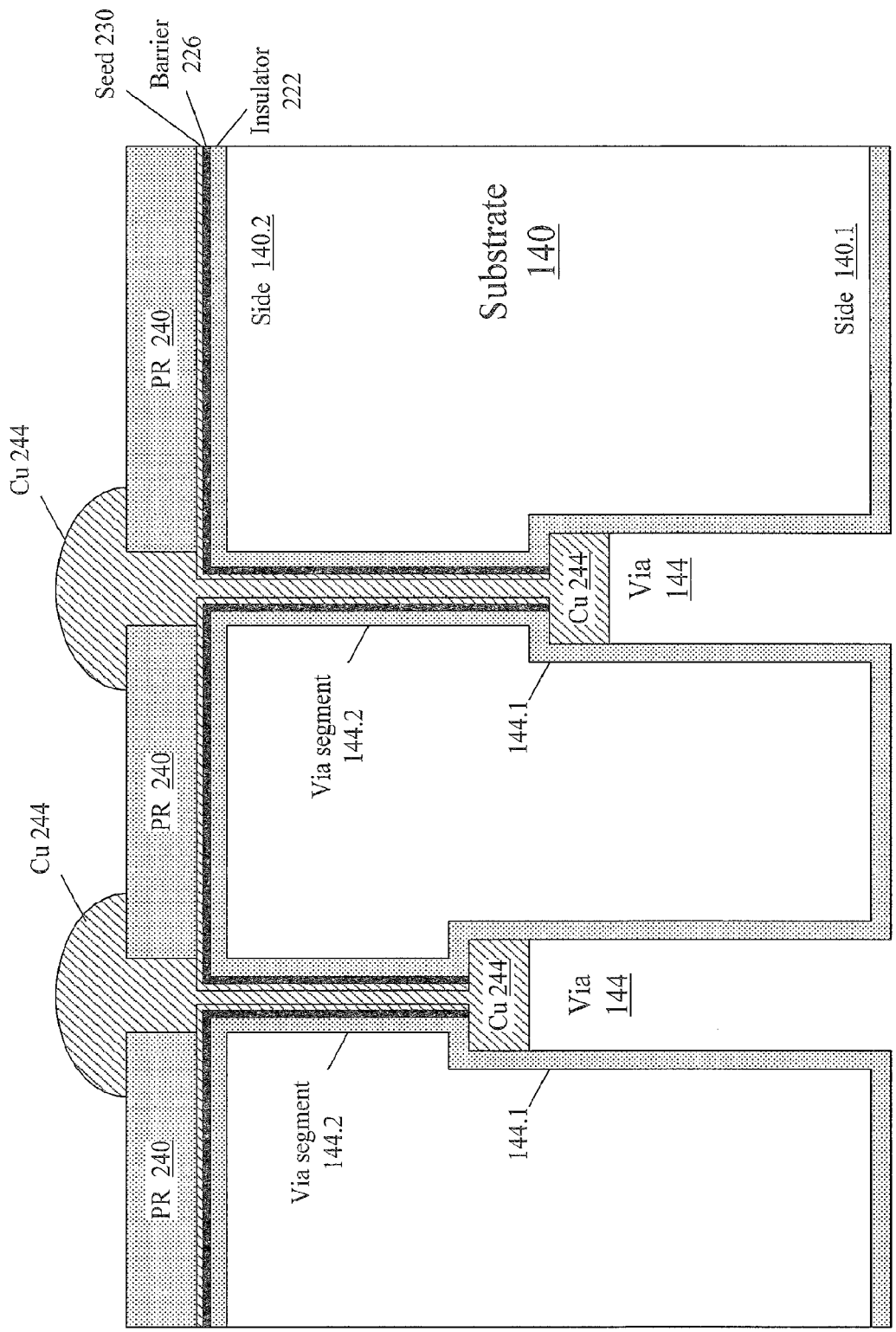
Figure 2G:
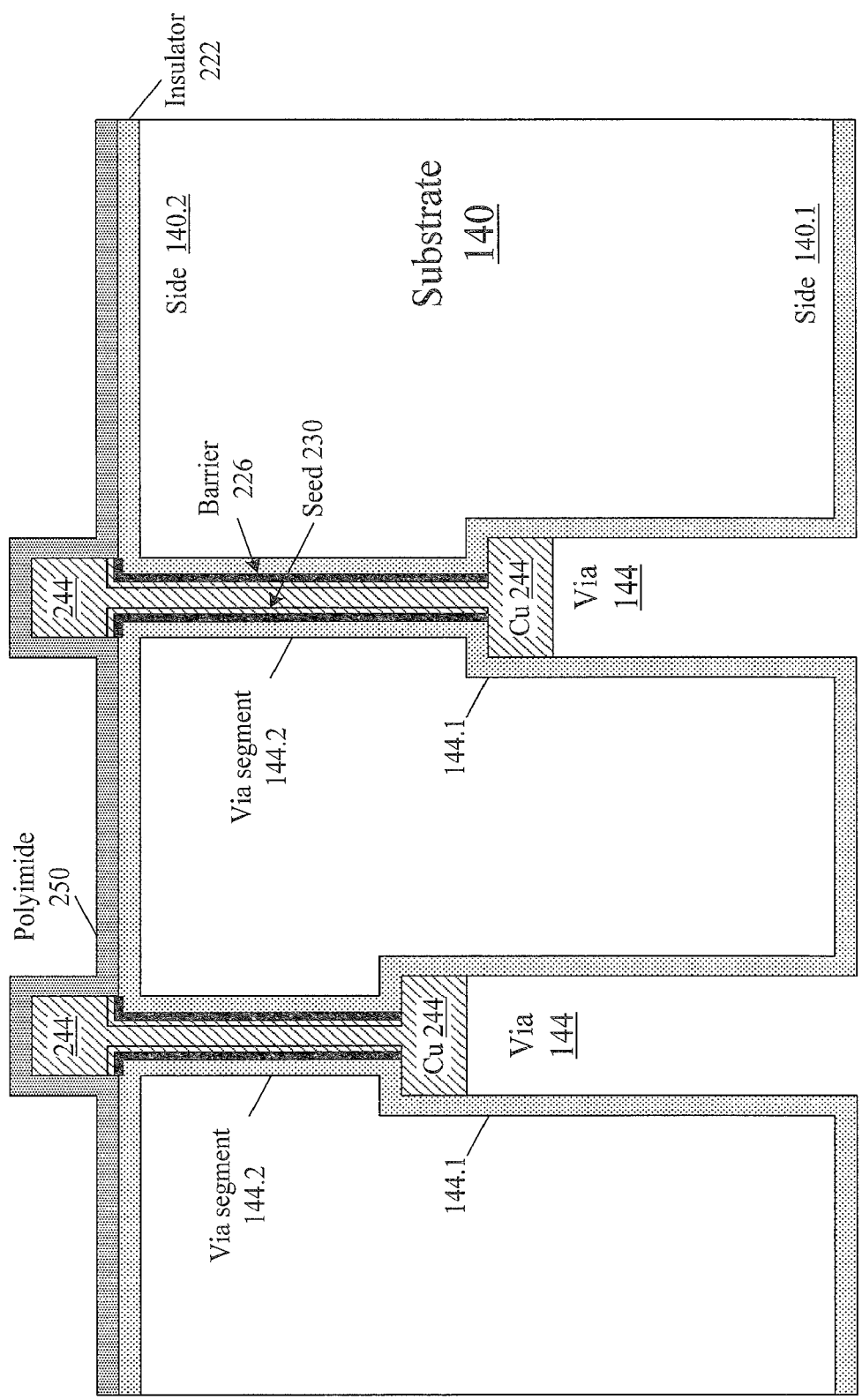
Figure 2H:
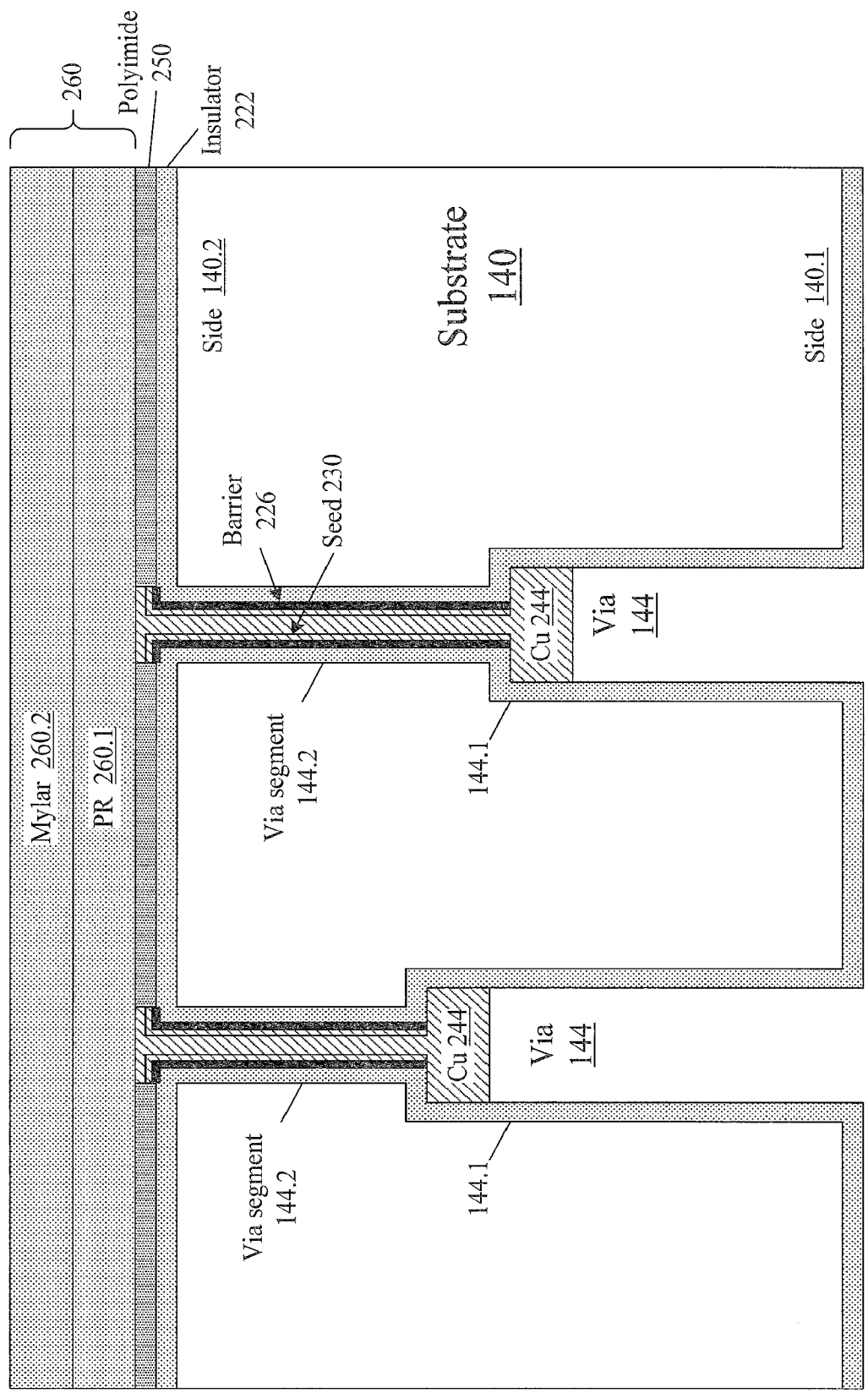
Figure 2I:
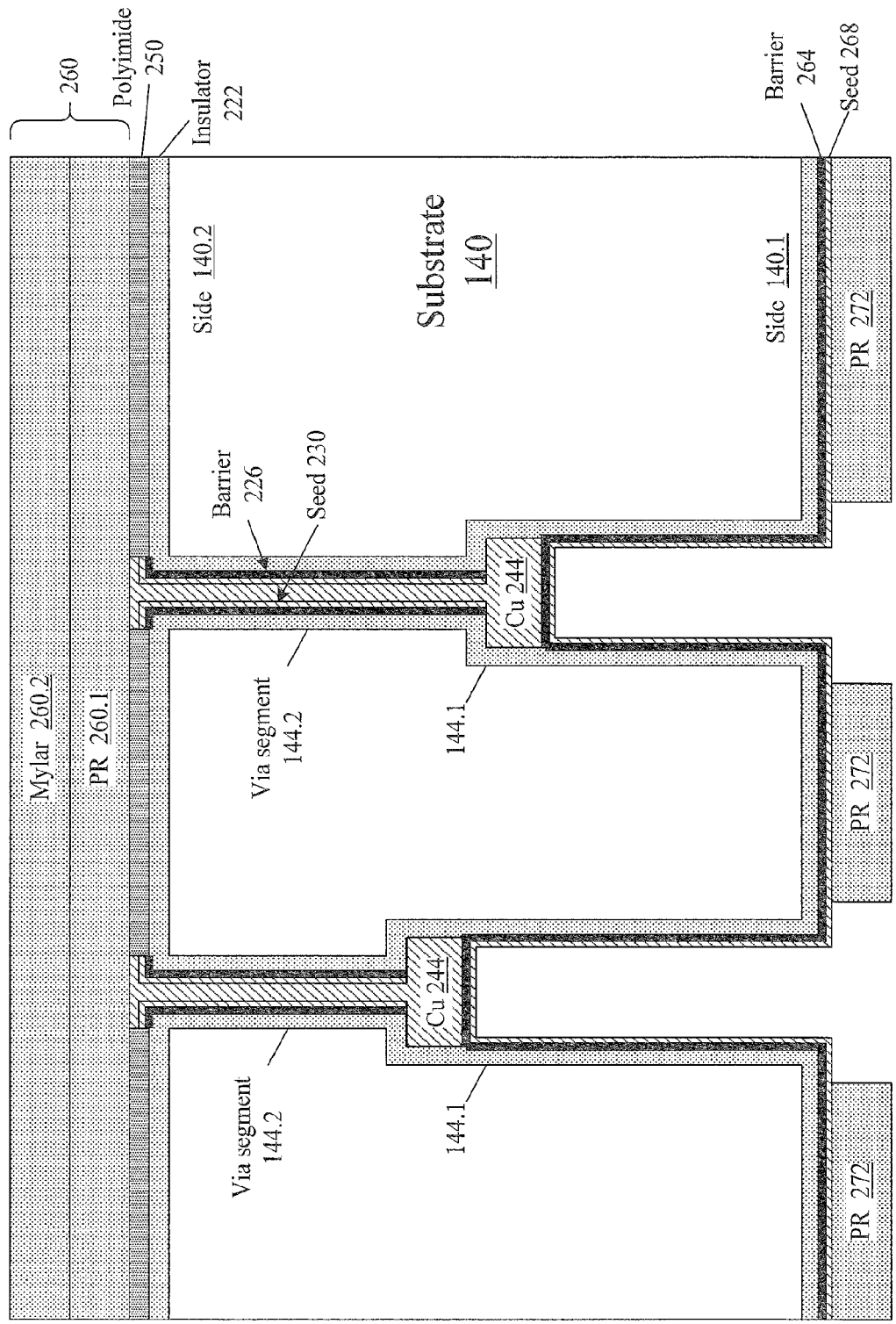

FIG. 2G shows subsequent processing of wafer side 140.2. In this example, the copper portions protruding above the resist 240 are removed by a CMP process stopping on resist 240. Then resist 240 is stripped. The exposed portions of seed and bather layers 230, 226 can be etched away, by a dry or wet etch for example. Copper 244 can be slightly etched during the seed layer removal. In other embodiments, layers 230 and 226 are left on the wafer to provide a conductive path from a power supply to via segments 144.2 in order to electroplate these segments with copper (see the description below in connection with FIG. 2J). Also, layers 230 and 226 can be patterned to form conductive features if needed.

Then an insulating coat 250, e.g. a 2.5 µm layer of polyimide, is formed over the wafer side 140.2 if desired. For example, the polyimide can insulate the silicon 140 from solder 150 (FIG. 1) when the wafer 140 is later soldered to PCB 120. Other patterned or unpatterned layers can be formed on side 140.2 as needed.

Then a CMP process is applied to polish copper 244 and polyimide 250 down to the level of the planar polyimide portions surrounding the vias 144. See FIG. 2H.

Then a layer 260 is formed over the entire side 140.2 to protect this side during subsequent copper deposition into via segments 144.1. In some embodiments, layer 260 consists of a bottom photoresist layer 260.1 and a top Mylar layer 260.2.

Copper formation in wider via segments 144.1 can (but does not have to) use similar process steps to copper formation in via segments 144.2. In particular (see FIG. 2I), a bather layer 264 (e.g. 250 µm thick titanium-tungsten) can be deposited (e.g. by PVD, possibly sputtering) on side 140.1. A seed layer 268 is deposited on bather layer 264. For example, the seed layer can be copper initially deposited to a 1 µm thickness by PVD, e.g. sputtering. (If desired, the seed layer thickness can be increased by electrodeposition of additional copper.)

Figure 2J:
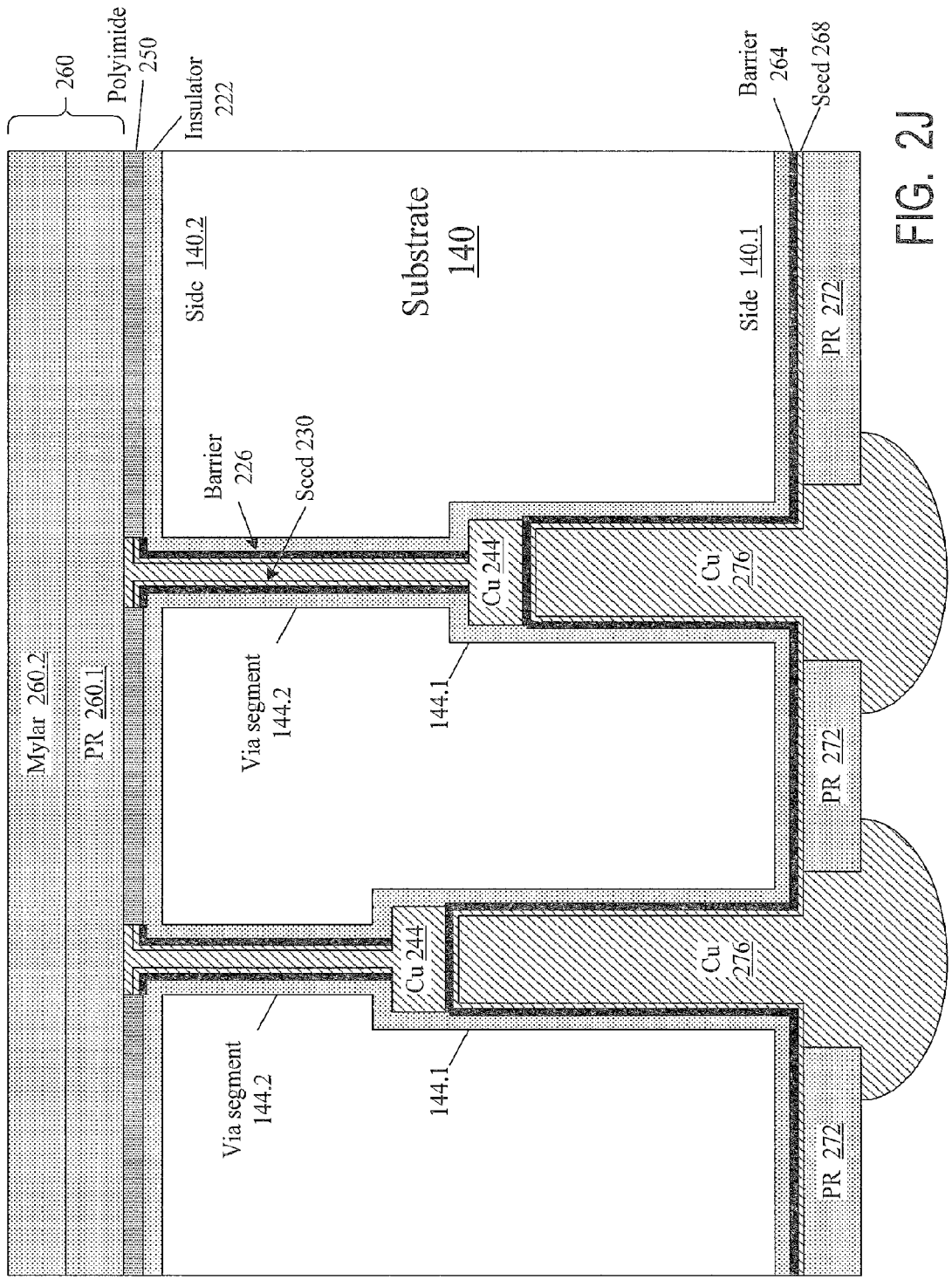

Bather layer 264 and seed layer 268 cover the side 140.1 and the exposed portions of the sidewalls of wide via segments 144.1. The two layers also cover the exposed surfaces of copper 244 in segments 144.1. The two layers are deposited to a shallower depth than the depth of the entire vias 144, so good quality deposition is facilitated. The shallow depth will also facilitate subsequent electroplating of copper 276 (FIG. 2J).

An electroplating mask 272 is then formed by depositing photoresist over the substrate's first side 140.1 and photolithographically patterning the resist to expose the vias 144 and, possibly, the immediately adjacent areas. In some embodiments, the exposed areas are 85 µm in diameter around each via segment 144.1, and each via segment 144.1 is at the center of the exposed area. In addition, mask 272 exposes seed layer 268 at the edge of substrate 140 for connection to the cathode of a power supply (not shown) for the subsequent electroplating step. (Alternatively, or in addition, the cathode can be connected to seed layer 230 at the wafer edge on side 140.2 if layer 230 remains not only around vias 144 as in FIG. 2I but also connects the vias to the wafer edge.) Other areas (not shown) may also be exposed on side 140.1 if electroplating is to be performed on those areas.

Copper 276 (FIG. 2J) is electroplated onto the exposed portions of seed layer 268 and, possibly, in some adjacent areas. Vias 144 become completely filled with copper, the bather layer, and insulator 222. Copper 276 may protrude down below the photoresist 272.

Figure 2K:
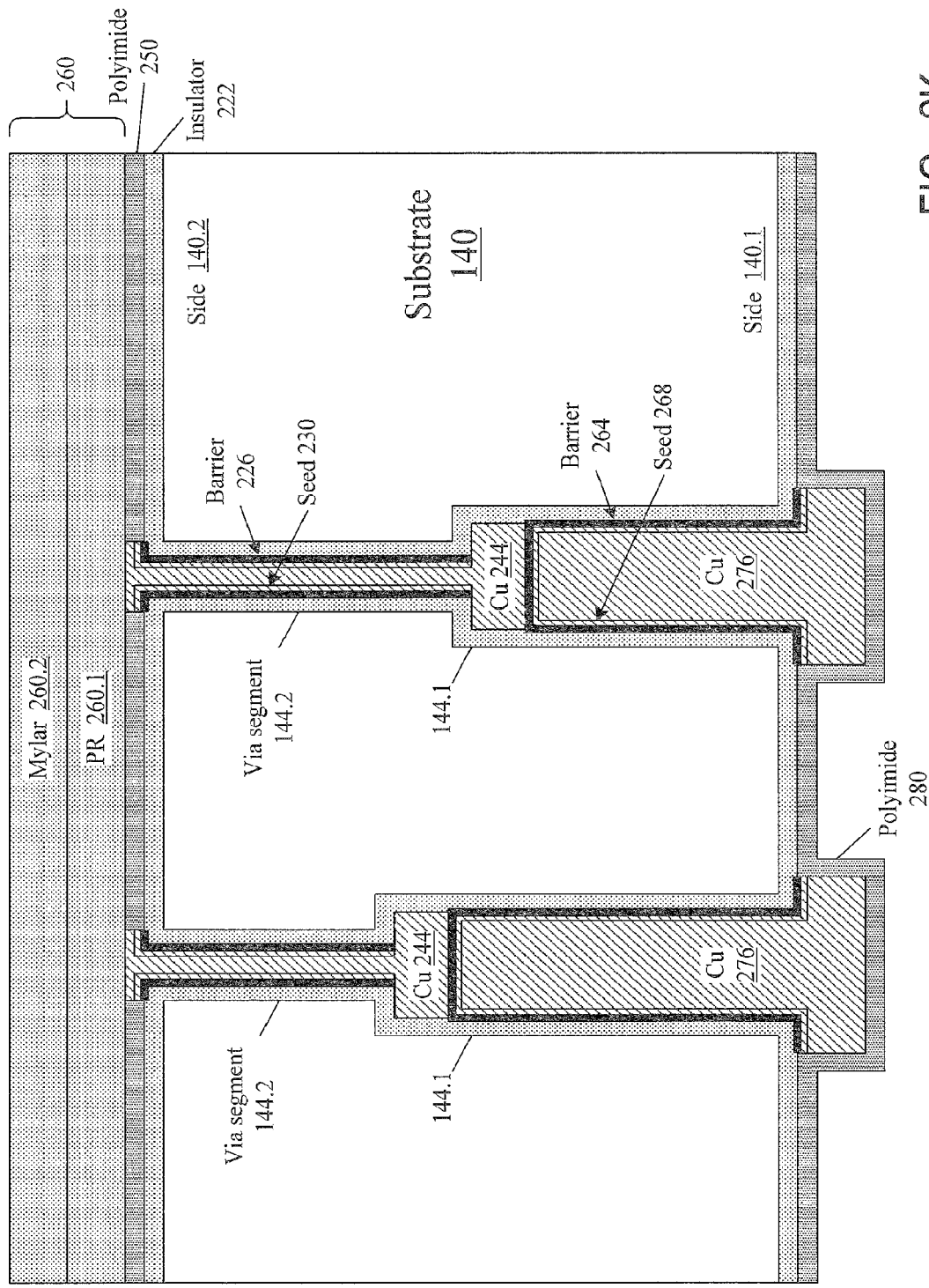

FIG. 2K shows subsequent processing of wafer side 140.1. In this example, the copper 276 portions protruding below the resist 272 are removed by a CMP process stopping on the resist. Then resist 272 is stripped. The exposed portions of seed and bather layers 268, 264 can be etched away, by a dry or wet etch for example. Copper 276 can be slightly etched during the seed layer removal.

Then an insulating coat 280, e.g. a 2.5 µm layer of polyimide, is formed over the wafer side 140.1 if desired (the polyimide will be used for further wafer patterning in some embodiments, e.g. to form rerouting layer 154 as shown in FIG. 1). Other patterned or unpatterned layers can be formed on side 140.1 as needed.

Figure 2L:
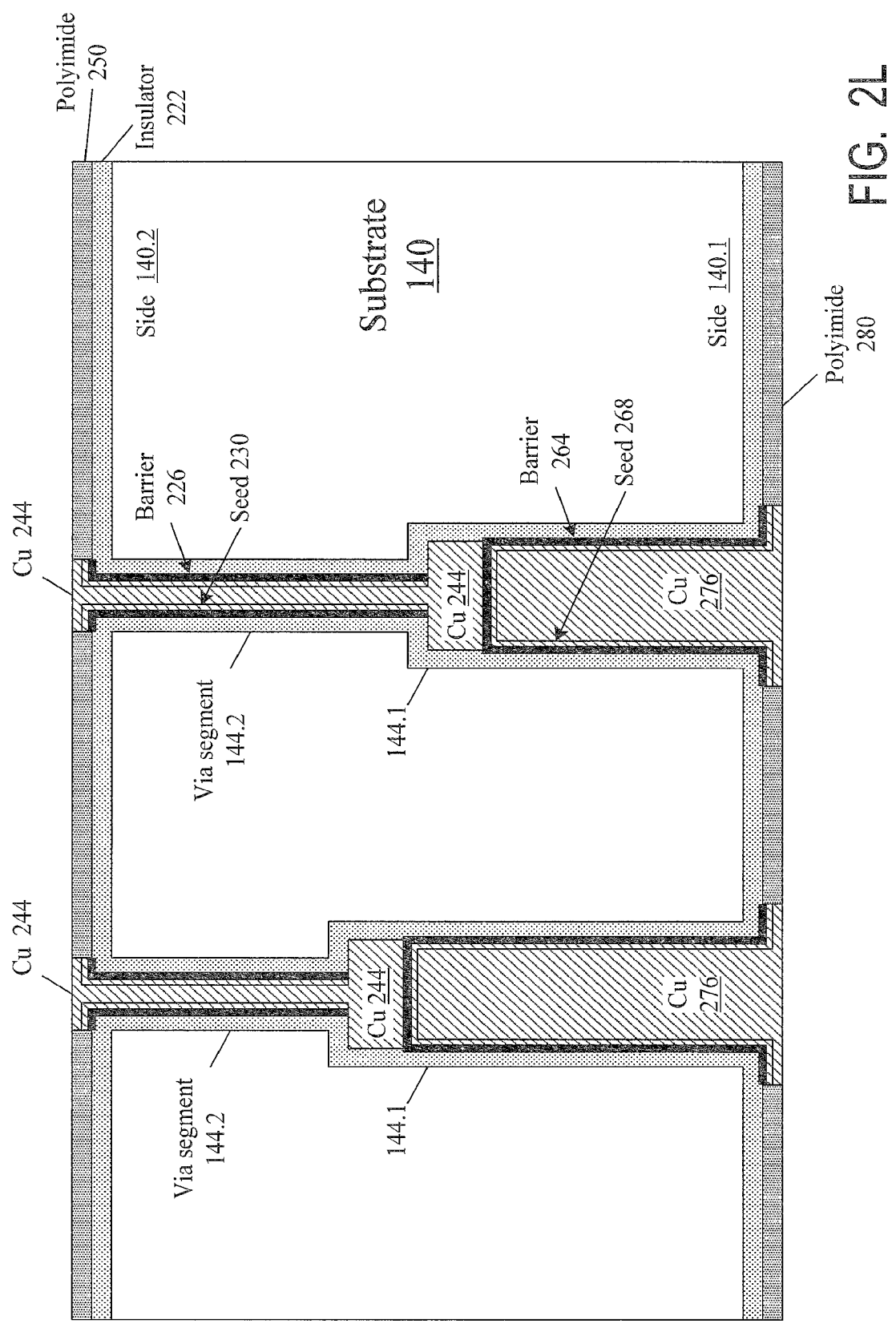

As shown in FIG. 2L, a CMP process is applied to polish copper 276 and polyimide 280 down to the level of the planar polyimide portions surrounding the vias 144. Then protective layer 260 is removed by stripping the resist 260.1.

Subsequent processing depends on the particular desired use of substrate 140. For example, an interposer 130 can be constructed as in FIG. 1. Rerouting layers 154 can be formed on side 140.1 and/or side 140.2 by depositing and patterning insulating and conductive layers. The insulating layers may include polyimide layers 250 and/or 280. The conductive layers will provide lines 158 and contact pads 130C.1, 130C.2. These contact pads can be attached to contact pads 110C, 120C by solder, or conductive adhesive, or other means (e.g. bond wires).

If substrate 140 is used as in FIG. 1, then in some embodiments the dies 110 are attached at the side 140.2 and the PCB 120 to side 140.1. The wider vias 144.1 on side 140.1 match larger solder balls often used for PCB attachment. On the other hand, the narrower vias 144.2 leave more substrate area between the vias on side 140.2. The greater substrate area can be efficiently utilized for a dense network of conductive lines 158. In some embodiments, the greater substrate area would be wasted if side 140.2 were attached to the PCB because the larger solder balls 150 would expand into this area. However, in some embodiments, side 140.2 is attached to the PCB.

Interposer 130 can be connected to other interposers and/or dies on both sides (top and bottom). Substrate 140 can be diced into dies. Other passive and active circuit elements can be formed in the interposer.

Many variations are possible. For example, in some embodiments, metal does not fill the center portions of via segments 144.1 and/or 144.2 but rather forms a thin film on the via sidewalls. In the example of FIG. 3, metal fills via segments 144.2 but not via segments 144.1. This structure can be fabricated substantially as in FIG. 2I, without depositing copper 276 (FIG. 2J). Metal 264, 268 in FIG. 3 can be patterned using known techniques as desired, and can be attached to another structure (e.g. to a die 110 or a PCB 120 as in FIG. 1) at the locations of vias 144.1 or at some other locations defined by rerouting layer 154 if one is made on side 140.1. Due to omission of copper 276, each via segment 144.1 has a void which may be filled with solder, insulator (e.g. polyimide), or some other material, or may be left unfilled.

Via segments 144.2 may also have metal only on the sidewalls. The sidewall metal can be formed essentially like metal layers 226, 230 in FIG. 2E. Copper filling 244 of FIG. 2F is then omitted.

The process steps illustrated in FIGS. 2A-2L may be interspersed with other steps that form circuit elements and various features in or on substrate 140.

Some embodiments provide a structure comprising a substrate having a first side and a second side opposite to the first side. The substrate comprises a first material (e.g. silicon, glass, etc; the first material may have admixture, e.g. doped regions may be present in silicon 140). A through via passes through the first material of the substrate (e.g. through the silicon with or without doped regions) between the first and second sides. The through via has a first segment and a second segment joining the first segment inside the substrate. The first segment extends from the first side to the second segment. The second segment extends from the first segment to the second side. The first segment has an end adjacent to the second segment. In the example of FIG. 2C, this is the bottom end of via segment 144.1. FIG. 4A shows a via 144 at the stage of FIG. 2C, after removal of etch stop layer 214. In FIG. 4A, the bottom end is marked 144.1E.

The second segment has an end adjacent to the first segment (e.g. top end 144.2E in FIG. 4A).

When viewed from the first side (e.g. in the top view shown in FIG. 4B for the example of FIG. 4A), said end of the first segment (end 144.1E in the example) completely laterally surrounds said end of the second segment (end 144.2E) but is laterally spaced from said end of the second segment.

In FIG. 4A, the via segments 144.1, 144.2 have vertical sidewalls, but this is not necessary. For example, one or both of segments 144.1 and 144.2 may have conical or some other shape.

The structure also comprises a conductive feature passing through the through via. For example, in FIG. 2L, the conductive feature includes copper 244, 276 and the portions of barrier and seed layers 264 and 268 which separate copper 244 from copper 276. The conductive feature may also be interpreted to include all metal layers 226, 230, 264, 268, 244, 276 in via 144. Metal can be replaced, or used in conjunction with, other conductive materials in the conductive feature.

The conductive feature forms at least a part of a conductive path provided for connection to a circuit element of an integrated circuit (e.g. for connection to a contact 110C of a die 110 in FIG. 1; the connection can also be through another interposer or in some other manner). The conductive feature passes adjacent to all of an entire sidewall surface of the first segment and adjacent to all of an entire sidewall surface of the second segment. For example, in FIG. 2L, the conductive feature consisting of layers 226, 230, 264, 268, 244, 276, or of layers 264, 268, 244, 276, is formed over all the sidewalls of via 144.

In some embodiments, the second segment is shorter than the first segment. For example, segment 144.2 can be shorter than segment 144.1.

In some embodiments, the following relationship holds true between the aspect ratio AR1 of the first segment and the aspect ratio AR2 of the second segment:

$$1/10 < AR2/AR1 < 10$$

The aspect ratio of each segment is the ratio of the segment's depth to the segment's width. If the segment has different widths at different depths, then the aspect ratio is the ratio of the segment's total depth to the maximum width.

The width at each depth is the via segment's diameter at that depth if the segment is circular at that depth. More generally (for both circular and non-circular segments), the via segment's width at a given depth (i.e. the width of the horizontal cross section at that depth) can be defined as illustrated in FIG. 5. In this example, the via's horizontal cross section at some depth is a rectangle ABCD, but the same discussion applies to non-rectangular vias. To obtain the width at this depth, first the widths are measured in different horizontal directions, such as directions D1 and D2 shown in FIG. 5. The width in any direction is defined as the maximum width in that direction, i.e. the maximum length of the linear cross section by a horizontal line parallel to that direction. The direction D1 is parallel to the rectangle's sides AB and CD. Therefore, if a horizontal line parallel to D1 intersects the via, then the linear cross section has a length equal to AB or CD. Therefore, the via width in the D1 direction is equal to the length of AB.

Direction D2 is parallel to the diagonal AC. Different horizontal lines intersecting the via and parallel to D2 will have linear cross sections of different lengths, varying from 0 (if the line passes through vertex B or D) to the maximum equal to the length of AC. Therefore, the via width in direction D2 is the length of AC.

Of the widths in all directions, the minimum is chosen. In the example of FIG. 5, the minimum is AB (the rectangle's shortest side).

In some embodiments,

⅕<AR2/AR1<5 or

1/1.5<AR2/AR1<1.5

Other ranges are also possible for AR2/AR1.

Some embodiments provide a structure comprising a substrate having a first side and a second side opposite to the first side, the substrate comprising a first material. A through via passes through the first material of the substrate between the first and second sides. The through via comprises a first region (e.g. "joining" region 410 (FIG. 4A) in which the via segment 114.1 joins via segment 144.2) between the first and second sides. The through via widens when passing through the first region from the second side to the first side. For example, in FIG. 4A, the via widens when passing through region 410 from bottom to top.

When the structure is viewed with the first side at the top and the second side at the bottom (e.g. as in FIG. 4A), then for any planar vertical cross section of the through via (e.g. the cross section of FIG. 4A or any other planar vertical cross section), when the through via is traced from the second side to the first side (e.g. from bottom to top in FIG. 4A), a change in the through via's width (measured in the planar vertical cross section) per unit height is greater in the first region than immediately below the first region. For example, let W denote the via 144 width in the vertical cross section of FIG. 4A. Let H denote the height measured from any point, e.g. from the bottom side 140.2. In segment 144.2, W is constant (e.g. 45 μm), so the change ΔW per unit height is zero. In region 410, the width W increases sharply (e.g. from 45 μm to 65 μm), so the change ΔW per unit height becomes very large (assuming that the width increases from 45 μm to 65 μm over a very small increase in height).

In FIG. 4A, via segments 144.1 and 144.2 form a horizontal step in the joining region 410. In contrast, in FIG. 6, via 144 has sloped sidewalls in the joining region. FIG. 6 is the same view as FIG. 4A of a different embodiment. In FIG. 6, the width W increases more per unit height in joining region 410 then in the region immediately below the region 410 (i.e. in the region of vertical sidewalls of via segment 410.2).

The structure comprises a conductive feature passing through the through via and forming at least a part of a conductive path provided for connection to a circuit element of an integrated circuit.

In some embodiments, when the structure is viewed with the first side at the top and the second side at the bottom, and the through via is traced from the second side to the first side, a change in the through via's width (defined as in the discussion of FIG. 5 above) per unit height is greater in the first region than immediately below the first region.

Some embodiments provide a manufacturing method comprising:

forming a first segment of a via in a first side of a substrate comprising a first material, the first segment entering the first material and terminating inside the substrate (see FIG. 2A for example);

forming a first layer (e.g. 214) in the first segment;

forming a second segment of the via in a second side of the substrate by a process comprising removal of the first material (e.g. silicon) selectively to the first layer, the second segment terminating at the first layer; and removing at least a portion of the first layer (e.g. 214) to connect the first segment to the second segment.

Other embodiments and variations are within the scope of the invention, as defined by the appended claims.

The invention claimed is:

1. A structure comprising:
   (1) a substrate having a first side and a second side opposite to the first side, the substrate comprising a first material;
   (2) a through via passing through the first material of the substrate between the first and second sides, the through via having a first segment and a second segment joining the first segment inside the substrate, the first segment extending from the first side to the second segment, the second segment extending from the first segment to the second side, the first segment having an end adjacent to the second segment, the second segment having an end adjacent to the first segment;
   wherein when viewed from the first side, said end of the first segment completely laterally surrounds said end of the second segment but is laterally spaced from said end of the second segment;
   (3) a conductive feature passing through the through via and forming at least a part of a conductive path provided for connection to a circuit element of an integrated circuit, the conductive feature comprising:
   a first conductive section present in the first segment;
   a second conductive section present in the second segment and extending into the first segment, wherein when viewed from the first side, a portion of the second conductive section in the first segment spreads laterally beyond said end of the second segment; and
   a first conductive layer separating the first conductive section from the second conductive section and present in the first segment but not in the second segment, the first conductive layer being a material not present in the first segment in the first and second conductive sections.

2. The structure of claim 1 wherein the first material is semiconductor, and the structure comprises an insulator insulating the conductive feature from the substrate.

3. The structure of claim 1 wherein the second segment is shorter than the first segment.

4. The structure of claim 1 further comprising said integrated circuit having the circuit element connected to the conductive feature.

5. The structure of claim 1 wherein the first conductive layer separates the first section from an entire sidewall surface of the first segment.

6. The structure of claim 1 wherein the first conductive layer is a barrier layer.

7. The structure of claim 1 wherein the first conductive section comprises copper, and the first conductive layer comprises titanium-tungsten.

8. The structure of claim 1 wherein the first conductive layer physically contacts the first and second conductive sections.

9. The structure of claim 1 further comprising a second conductive layer separating the second conductive section from an entire sidewall surface of the second segment, the second conductive layer being a material not present in the second conductive section, the second conductive layer not reaching the first conductive layer.

10. The structure of claim 9 wherein the second conductive layer is a barrier layer.

11. The structure of claim 9 wherein the second conductive section comprises copper, and the second conductive layer comprises titanium-tungsten.

12. A structure comprising:
(1) a substrate having a first side and a second side opposite to the first side, the substrate comprising a first material;
(2) a through via passing through the first material of the substrate between the first and second sides, the through via comprising a first region between the first and second sides, the through via widening when passing through the first region from the second side to the first side;
wherein when the structure is viewed with the first side at the top and the second side at the bottom, then for any planar vertical cross section of the through via, when the through via is traced from the second side to the first side, a change in the through via's width (measured in the planar vertical cross section) per unit height is greater in the first region than immediately below the first region;
(3) a conductive feature passing through the through via and forming at least a part of a conductive path provided for connection to a circuit element of an integrated circuit, the conductive feature comprising:
a first conductive section present between the first region and the first side;
a second conductive section present between the first conductive section and the second side and passing through the first region towards the first side, the second conductive section widening when passing through the first region from the second side to the first side; and
a first conductive layer separating the first conductive section from the second conductive section and from an entire sidewall surface of the through via, the first conductive layer being a material not present between the first region and the first side in the first and second conductive sections.

13. The structure of claim 12 wherein the first material is semiconductor.

14. The structure of claim 12 wherein the first conductive layer is a barrier layer.

15. The structure of claim 12 wherein the first conductive section comprises copper, and the first conductive layer comprises titanium-tungsten.

16. The structure of claim 12 further comprising a second conductive layer separating the second conductive section from an entire sidewall surface of the second region, the second conductive layer being a material not present in the second conductive section, the second conductive layer not reaching the first conductive layer.

17. The structure of claim 16 wherein the second conductive layer is a barrier layer.

18. The structure of claim 16 wherein the second conductive section comprises copper, and the second conductive layer comprises titanium-tungsten.

19. A structure comprising:
(1) a substrate having a first side and a second side opposite to the first side, the substrate comprising a first material;
(2) a through via passing through the first material of the substrate between the first and second sides, the through via comprising a first region between the first and second sides, the through via widening when passing through the first region from the second side to the first side;
wherein when the structure is viewed with the first side at the top and the second side at the bottom, and the through via is traced from the second side to the first side, a change in the through via's minimum width per unit height is greater in the first region than immediately below the first region;
(3) a conductive feature passing through the through via and forming at least a part of a conductive path provided for connection to a circuit element of an integrated circuit, the conductive feature comprising:
a first conductive section present between the first region and the first side;
a second conductive section present between the first conductive section and the second side and passing through the first region towards the first side, the second conductive section widening when passing through the first region from the second side to the first side; and
a first conductive layer separating the first conductive section from the second conductive section and from an entire sidewall surface of the through via, the first conductive layer being a material not present between the first region and the first side in the first and second conductive sections.

20. The structure of claim 19 wherein the first material is semiconductor.

21. The structure of claim 19 wherein the first conductive layer is a barrier layer.

22. The structure of claim 19 wherein the first conductive section comprises copper, and the first conductive layer comprises titanium-tungsten.

23. The structure of claim 19 further comprising a second conductive layer separating the second conductive section from an entire sidewall surface of the second region, the second conductive layer being a material not present in the second conductive section, the second conductive layer not reaching the first conductive layer.

24. The structure of claim 23 wherein the second conductive layer is a barrier layer.

25. The structure of claim 23 wherein the second conductive section comprises copper, and the second conductive layer comprises titanium-tungsten.

* * * * *

UNITED STATES PATENT AND TRADEMARK OFFICE
CERTIFICATE OF CORRECTION

PATENT NO. : 9,589,879 B2
APPLICATION NO. : 14/697460
DATED : March 7, 2017
INVENTOR(S) : Valentin Kosenko and Sergey Savastiouk Page 1 of 1

It is certified that error appears in the above-identified patent and that said Letters Patent is hereby corrected as shown below:

In the Specification

In Column 5, Line 53 and Column 6, Lines 12, 14, 19, 46 and 52:
Delete "bather" and insert --barrier--.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*